US012222658B2

(12) United States Patent
Miyao et al.

(10) Patent No.: US 12,222,658 B2
(45) Date of Patent: Feb. 11, 2025

(54) STAGE APPARATUS AND ELECTRON BEAM LITHOGRAPHY SYSTEM

(71) Applicant: JEOL Ltd., Tokyo (JP)

(72) Inventors: Hirofumi Miyao, Tokyo (JP); Noriyuki Kobayashi, Tokyo (JP)

(73) Assignee: JEOL Ltd., Tokyo (JP)

( * ) Notice: Subject to any disclaimer, the term of this patent is extended or adjusted under 35 U.S.C. 154(b) by 410 days.

(21) Appl. No.: 17/849,776

(22) Filed: Jun. 27, 2022

(65) Prior Publication Data

US 2022/0413396 A1    Dec. 29, 2022

(30) Foreign Application Priority Data

Jun. 28, 2021  (JP) ................................ 2021-106300

(51) Int. Cl.
*G03F 7/00* (2006.01)
*H01J 37/20* (2006.01)
*H01J 37/31* (2006.01)
*H01J 37/317* (2006.01)

(52) U.S. Cl.
CPC ...... *G03F 7/70716* (2013.01); *G03F 7/70516* (2013.01); *G03F 7/7085* (2013.01); *H01J 37/20* (2013.01); *H01J 37/3174* (2013.01)

(58) Field of Classification Search
CPC ............. G03F 7/70716; G03F 7/70516; G03F 7/7085; H01J 37/20; H01J 37/3174
See application file for complete search history.

(56) References Cited

U.S. PATENT DOCUMENTS

2004/0250776 A1    12/2004    Mizuochi et al.
2015/0277229 A1*   10/2015    Kimura ............... G03F 7/70816
                                                               355/72
2022/0223443 A1    7/2022     Maki et al.

FOREIGN PATENT DOCUMENTS

| JP | H08318439 A | 12/1996 |
|---|---|---|
| JP | 2004296583 A | 10/2004 |
| JP | 200579373 A | 3/2005 |
| JP | 2012146774 A | 8/2012 |
| JP | 201510705 A | 1/2015 |
| JP | 202045982 A | 3/2020 |
| WO | 2020196195 A1 | 10/2020 |

OTHER PUBLICATIONS

Office Action issued in JP2021-106300 on Jul. 25, 2023.
Office Action issued in JP2021106300 on Nov. 14, 2023.

* cited by examiner

*Primary Examiner* — Nicole M Ippolito
(74) *Attorney, Agent, or Firm* — The Webb Law Firm

(57) ABSTRACT

A stage apparatus includes a surface plate as well as a guide shaft fixedly secured to the surface plate, a drive member moving along the guide shaft, and a hydrostatic fluid bearing that forms fluid films in the gap portion between the guide shaft and the drive member. The apparatus further includes: a positional deviation detection section—for detecting a relative positional deviation which occurs between the guide shaft and the drive member and which affects the thickness dimensions of the fluid films; and a state decision section for making a decision on the condition of the apparatus itself based on the positional deviation detected by the detection section and outputting information responsive to the decision.

6 Claims, 10 Drawing Sheets

STAGE APPARATUS AND ELECTRON BEAM LITHOGRAPHY SYSTEM

CROSS REFERENCE TO RELATED APPLICATION

The application claims priority to Japanese Patent Application No. 2021-106300, filed Jun. 28, 2021, the disclosure of which is hereby incorporated by reference in its entirety.

BACKGROUND OF THE INVENTION

1. Field of the Invention

The present invention relates to a stage apparatus and an electron beam lithography system.

2. Description of the Related Art

In process steps for manufacturing photomasks, there is used an electron beam lithography system which draws, using an electron beam, a pattern on a resist film formed on a photomask blank. As semiconductor devices are fabricated in smaller sizes and at higher accuracy, electron beam lithography systems are required to have higher lithography accuracy. One of factors affecting the lithography accuracy is the accuracy of a stage apparatus which provides movable support of a photomask blank or other substrate. The stage apparatus has a surface plate, guide shafts fixedly supported to the surface plate, and drive members that move along their respective guide shafts. Sometimes hydrostatic fluid bearings are used in the stage apparatus to enable smooth movement of the drive members along their respective guide shafts.

The hydrostatic fluid bearings accomplish smooth movement of the drive members by forming fluid films in gap portions between the guide shafts and the drive members by means of a lubricating fluid such that the drive members are floated a distance equal to the thickness dimension of the fluid films away from their respective guide shafts. Hydrostatic fluid bearings are classified into hydrostatic liquid bearings using a liquid as a lubricating fluid and hydrostatic gas bearings using a gas as a lubricating fluid. A hydrostatic gas bearing such as a hydrostatic air bearing is used in a stage apparatus in which the guide shafts and the drive members are placed in a vacuum environment.

JP-A-8-318439 sets forth a technique regarding a movement guiding apparatus which comprises: a surface plate having a reference plane; a first drive member operative to be moved in a first direction while guided on the reference plane by a guiding member; and a second drive member operative to be moved in a second direction intersecting the first direction. The first and second drive members are supported on the reference plane by hydrostatic bearings and impose no restraint on each other in a direction perpendicular to the reference plane. A preloading mechanism is mounted on at least one of the first and second drive members.

In the stage apparatus using hydrostatic air bearings, the drive members are floated by formation of air films. Therefore, it is necessary to constantly supply compressed air into the gap portions between the guide shafts and the drive members. Contact between the guide shafts and the drive members is effectively avoided by setting large the thickness dimensions of the air films that determine the amount of float of the drive members. However, in the case of this stage apparatus in which the guide shafts and the drive members are placed in a vacuum environment, if the dimension of the thickness of each air film is increased, the flow rate of air leaking into the vacuum increases, thus deteriorating the degree of vacuum. Therefore, when hydrostatic air bearings are used in a vacuum environment, the dimension of the thickness of each air film is required to be reduced to a minimum.

However, if the dimension of the thickness of each air film is reduced, the possibility that the guide shafts and the drive members make contact with each other is increased. If they contact each other, the drive members cannot be moved normally. In addition, a long time is needed to return the stage apparatus to its normal state.

SUMMARY OF THE INVENTION

In an attempt to solve the foregoing problem, the present invention has been made. It is an object of the present invention to provide a stage apparatus and an electron beam lithography system which can effectively suppress contact between a guide shaft and a drive member even if the thickness dimensions of fluid films formed by a hydrostatic fluid bearing are not increased.

The present invention provides a stage apparatus comprising: a surface plate; a guide shaft fixedly secured to the surface plate; a drive member that moves along the guide shaft such that a gap portion is left between the guide shaft and the drive member; and a hydrostatic fluid bearing that forms fluid films in the gap portion, the fluid films having thickness dimensions. The stage apparatus further includes: a positional deviation detection section for detecting a relative positional deviation which occurs between the guide shaft and the drive member and which affects the thickness dimensions of the fluid films; and a state decision section for making a decision on the condition of the stage apparatus itself based on the positional deviation detected by the positional deviation detection section and outputting information responsive to the decision.

Furthermore, the present invention provides an electron beam lithography system which is equipped with the stage apparatus described in the immediately preceding paragraph and which delineates a pattern with an electron beam on a sample movably supported by the stage apparatus.

According to the present invention, mechanical contact between the guide shaft and the drive member can be effectively suppressed without increasing the thickness dimensions of the fluid films formed by the hydrostatic fluid bearing.

DESCRIPTION OF THE INVENTION

Figure 1:
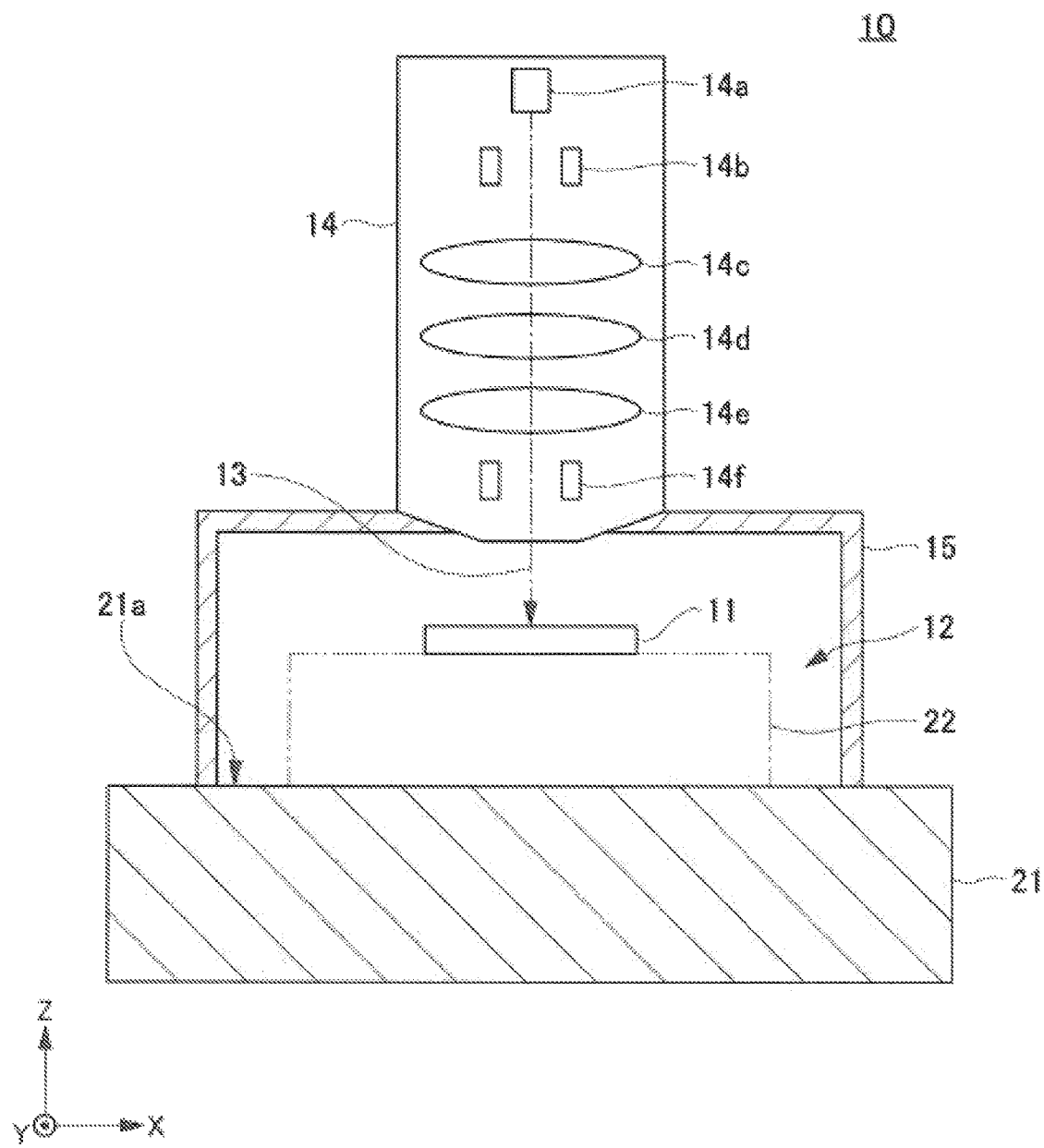
FIG. 1 is a schematic side elevation of an electron beam lithography system associated with one embodiment of the present invention, illustrating one example of configuration of the lithography system.

Embodiments of the present invention are hereinafter described in detail with reference to the accompanying drawings, in which components having identical functions or configurations are designated by identical reference numerals; a repetition of the description thereof is omitted.

FIG. 1 is a schematic side elevation of an electron beam lithography system associated with one embodiment of the present invention, illustrating one example of the configuration of the lithography system. As shown, the electron beam lithography system, 10, has a stage apparatus 12 for providing movable support of a sample 11 and an electron beam source 14 for emitting an electron beam 13. The lithography system 10 delineates a pattern on the sample 11 with the electron beam 13 while the sample 11 is supported to the stage apparatus 12. For example, the sample 11 is a photomask blank on which a resist film is formed. The electron beam lithography system 10 is also referred to as an electron beam exposure system.

In FIG. 1, an X direction and a Y direction are parallel to a horizontal plane, and a Z direction is parallel to a vertical plane, i.e., lies in a vertical direction. Also, in FIG. 1, for the sake of convenience, each of the X, Y, and Z directions is indicated by an arrow directed in one direction. The X direction means the left/right direction in FIG. 1. The Y direction means the depthwise direction in FIG. 1 and is orthogonal to the plane of the paper of FIG. 1. The Z direction means the up/down direction in FIG. 1. The same conventions apply to the other figures.

The stage apparatus 12 has a surface plate 21 and a stage mechanism 22. The surface plate 21 is mounted on a building floor or the like via a vibration isolated table (not shown). The surface plate 21 has a reference plane 21a which is disposed parallel to a horizontal plane (X-Y plane). The stage mechanism 22 can move the sample 11 in the X and Y directions and has guide shafts and drive members, all of which are described later. The stage mechanism 22 is disposed within a vacuum chamber 15 where the sample 11 is placed in position. The configuration of the stage apparatus 12 will be described in detail below.

The electron beam source 14 has an electron gun 14a, blanking electrodes 14b, and three electrode lenses 14c, 14d, and 14e, and deflection electrodes 14f. The electron gun 14a emits the electron beam 13. The blanking electrodes 14b turn on and off the electron beam 13 emitted from the electron gun 14a. When turned on by the blanking electrodes 14b, the electron beam 13 goes from the blanking electrodes 14b to the deflection electrodes 14f via the three electrode lenses 14c, 14d, and 14e. When turned off by the blanking electrodes 14b, the beam 13 is shut off by the blanking electrodes 14b.

The three electrode lenses 14c, 14d, and 14e operate to adjust the diameter or cross-sectional profile of the electron beam 13. The deflection electrodes 14f are used to deflect the beam 13 through a given angle relative to the optical center axis of the electron beam source 14. The position of the electron beam 13 on the sample 11 is controlled according to the shape of the pattern to be written on the sample 11. Also, the position of the beam 13 on the sample is controlled by a beam deflection control section (not shown) and a stage control section (not shown) equipped in the electron beam lithography system 10. The beam deflection control section controls the deflection angle of the electron beam 13 by adjusting a deflection current supplied to the deflection electrodes 14f. The stage control section controls the position of the sample 11 by moving drive members for an X stage and Y stages by utilizing differential air pressures. The drive members are equipped in the stage mechanism 22. The X stage and Y stages will be described in detail later.

The present inventors have noticed an issue that is described below. The electron beam lithography system 10 is required to have quite high lithography accuracy. Where the position of the electron beam 13 on the sample can be controlled accurately by the electron beam source 14, if the accuracy at which the sample 11 is placed in position gives rise to an error, then it is difficult to satisfy the high accuracy lithography requirement. Therefore, the main components of the stage mechanism 22 are made of a ceramic or other material which is not susceptible to strain. Bearings permitting movement of the X stage and Y stages are made of hydrostatic air bearings. The surface plate 21 forming a basis of the stage apparatus 12 is made of stone. Ceramics have excellent features including small stress induced deformations, small thermal expansion, and high wear resistance. Hydrostatic air bearings have advantages over ball bearings in terms of accuracy and reproducibility. Surface plates made of stone offer advantages over surface plate made of metals such as cast iron in terms of temperature induced deformations and wear resistance.

After an intensive discussion, we have found that if the surface plate 21 and the stage mechanism 22 are made of a material exhibiting small deformations and hydrostatic air bearings are used in the stage mechanism 22 as described above, it is difficult to operate the electron beam lithography system 10 normally for a long time while satisfying the high lithography requirements, for the following reasons.

Where the stage apparatus 12 is placed in the vacuum chamber 15, it is necessary to minimize the flow rate of air leaking into the vacuum chamber 15 from the hydrostatic air bearings in order to prevent deterioration of the degree of vacuum inside the vacuum chamber 15. The flow rate of air leaking into the vacuum chamber 15 decreases with reducing the thickness dimensions of the air films formed by the hydrostatic air bearings. However, reducing the thickness dimensions of the air films increases the possibility of contact between the guide shafts and the drive members of the stage mechanism 22.

Our discussion has led to a conclusion that the thickness dimensions of the above-described air films need to be decreased to less than 10 μm, preferably on the order of micrometers, in order to maintain the degree of vacuum in the vacuum chamber 15 and that even slight deformation of the stone-built surface plate can cause contact between the guide shafts and the drive members under such design conditions. Also, our discussion has led to another conclusion that if the stone-built surface plate is deformed, relative positional deviations occur between the guide shafts and the drive members and increase over time, thus bringing about contact between the guide shafts and the drive members.

Accordingly, the stage apparatus 12 of the electron beam lithography system 10 associated with the present embodiment has a positional deviation detection section for detecting relative positional deviations which occur between the guide shafts and the drive members and which affect the thickness dimensions of the air films. Information useful in avoiding contact between the guide shafts and the drive members is obtained based on the detection, i.e., the positional deviations detected by the positional deviation detection section. This will be described in further detail below.

Figure 2:
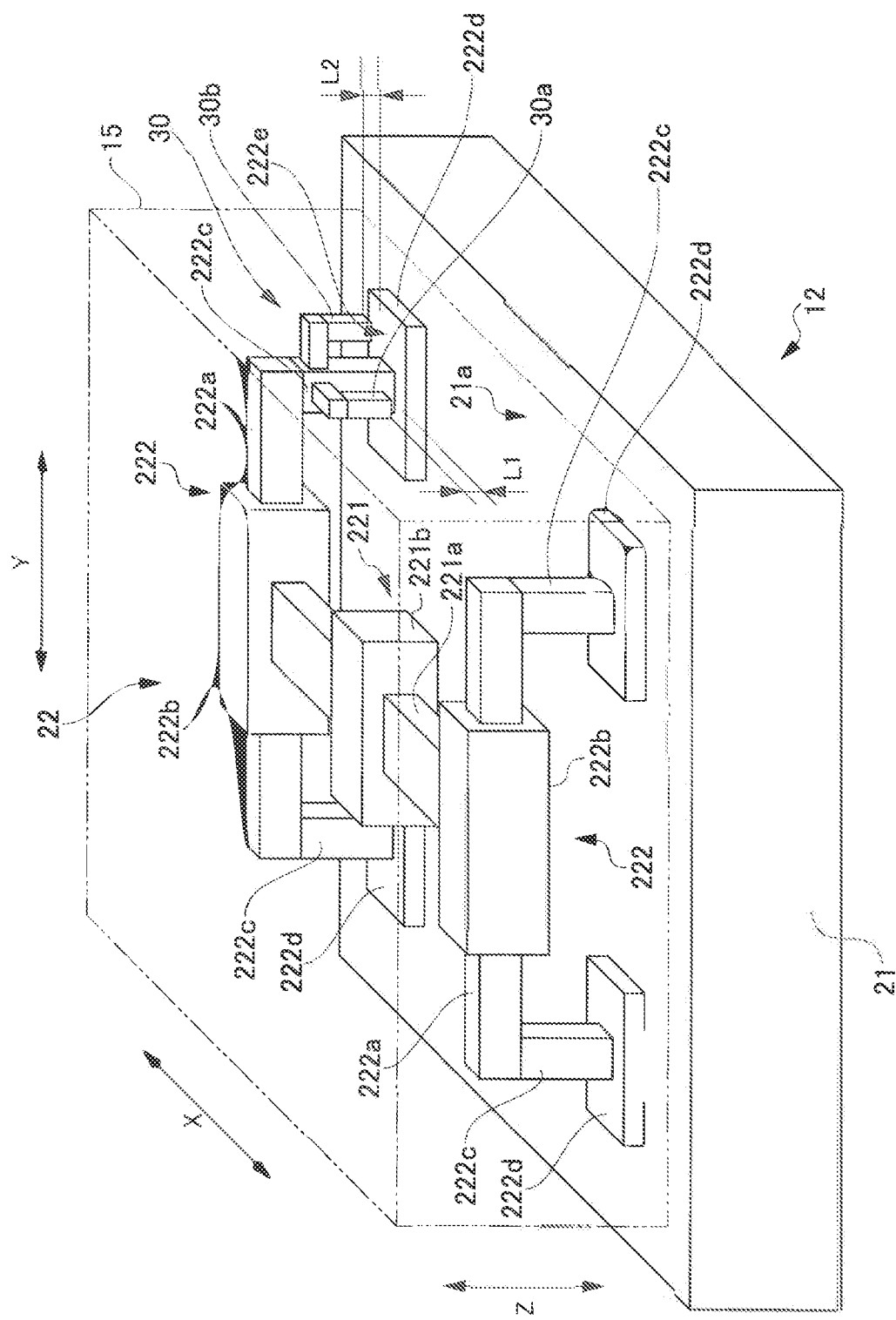
FIG. 2 is a perspective view of a stage apparatus shown in FIG. 1.

The configuration of the stage apparatus 12 is first described in detail. FIG. 2 is a perspective view showing the configuration of the stage apparatus associated with one embodiment of the present invention. As shown, the stage apparatus 12 has the surface plate 21 and the stage mechanism 22. The stage mechanism 22 has an X stage 221 and a pair of Y stages 222.

The X stage 221 has a guide shaft 221a arranged parallel to the X direction and a drive member 221b that moves along the guide shaft 221a. A sample stage (not shown) on which the sample 11 to be processed by lithography is placed and supported is attached to the top surface of the drive member 221b. The guide shaft 221a has a rectangular cross section as viewed vertically in a direction perpendicular to the X direction. The guide shaft 221a has four outer surfaces, i.e., a top surface, a bottom surface, and two side surfaces which act as guide surfaces for guiding movement of the drive member 221b. The drive member 221b has a rectangular cross section and is shaped tubularly around the four outer surfaces of the guide shaft 221a. A hydrostatic air bearing (not shown) is incorporated in the drive member 221b. The drive member 221b has four inner surfaces corresponding to the four outer surfaces of the guide shaft 221a. In the hydrostatic air bearing, air films are formed between the four outer surfaces of the guide shaft 221a and the respective four inner surfaces of the drive member 221b which are close and opposite to the outer surfaces. The drive member 221b is floated relative to the guide shaft 221a. Consequently, the drive member 221b is supported by the hydrostatic air bearing so as to be movable in the X direction that runs along the axis of the guide shaft 221a. The support stage using the hydrostatic air bearing is also referred to as a pneumatic stage. The drive member that is movably or slidably supported using the hydrostatic air bearing is also referred to as a slider. The guide shaft operative to guide movement of the drive member is also referred to as a stator. The X stage 221 and the Y stages 222 are common in terms of fundamental pneumatic stage configuration. The pneumatic stage configuration applied to the X stage 221 is described hereinafter.

Figure 3:
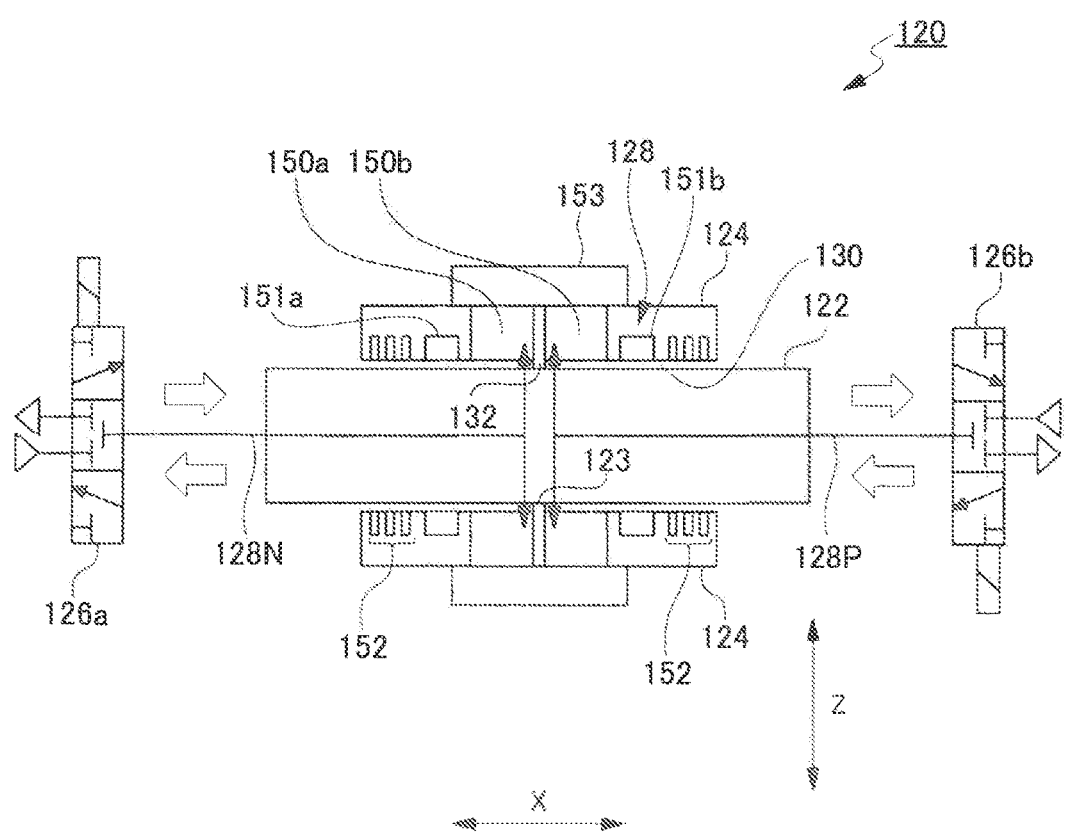
FIG. 3 is a vertical cross section of main portions of a pneumatic stage.

FIG. 3 is a vertical cross section showing main portions of the pneumatic stage. As shown, the pneumatic stage is generally indicated by reference numeral 120 and has a guide member 122, a slider 124, and two servo valves 126a, 126b. The pneumatic stage 120 is equivalent to the X stage 221. The guide member 122 is equivalent to the guide shaft 221a. The slider 124 is equivalent to the drive member 221b. The slider 124 is supported afloat from the guide member 122 by a hydrostatic air bearing 128. The hydrostatic air bearing 128 forms air films 130 in the portion where the guide member 122 and the slider 124 fit together. In particular, the hydrostatic air bearing 128 supports the slider 124 so as to be movable in the X direction by forming the air films 130 in the gap portions between the inner surfaces of the slider 124 and the opposite outer surfaces of the guide member 122.

The guide member 122 is made of a square shaft. A partition 132 is secured to the guide member 122. Two pressurized chambers 150a, 150b, two grooves 151a, 151b for supply of compressed air, and a plurality of (six in the illustrated example) suction grooves 152 for suction of air are formed in the slider 124. The outside of the two pressurized chambers 150a, 150b is closed off by a cover member 153. The two pressurized chambers 150a and 150b are partitioned from each other by the partition 132. In the description that follows, one pressurized chamber 150a is referred to as the first pressurized chamber 150a, while the other pressurized chamber 150b is referred to as the second pressurized chamber 150b.

The two grooves 151a and 151b are in communication with each other. Compressed air is supplied into each of the grooves 151a and 151b by a compressed air source (not shown). The supply of the compressed air forms the air films 130 between the outer surfaces of the guide member 122 and the inner surfaces of the slider 124. That is, the two grooves 151a, 151b cooperate with the compressed air source (not shown) to constitute the hydrostatic air bearing 128. The suction grooves 152 suck in air from the air films 130 in order to reduce the flow rate of air leaking into the vacuum chamber from the air films 130.

One servo valve 126a out of the two servo valves 126a, 126b controls the air pressure in the first pressurized chamber 150a, while the other servo valve 126b controls the air pressure in the second pressurized chamber 150b. The two servo valves 126a, 126b move the slider 124 in the X direction by creating a difference (differential pressure) in internal air pressure between the first pressurized chamber 150a and the second pressurized chamber 150b. In particular, the two servo valves 126a, 126b move the slider 124 in the rightward direction as viewed in the figure by making the air pressure in the first pressurized chamber 150a higher than that in the second pressurized chamber 150b. The two servo valves 126a, 126b move the slider 124 in the leftward direction as viewed in the figure by making the air pressure in the first pressurized chamber 150a lower than that in the second pressurized chamber 150b. The two servo valves 126a, 126b maintain the slider 124 at rest by making equal the air pressures in the first and second pressurized chambers 150a and 150b, respectively. The operation of the servo valves 126a, 126b is controlled by a valve control section (not shown) in response to an output signal from a position sensor (not shown) which is mounted to a sample stage attached to the slider 124, the position sensor operating to detect the position of the sample stage. The position sensor and the valve control section are components of the stage apparatus 12. A specific example of a position detecting mechanism for detecting the position of the sample stage is described below.

A mirror (not shown) is mounted to the slider 124 on which the sample stage is mounted to detect the positions of the sample stage taken in the X and Y directions. The mirror has a first reflective surface and a second reflective surface which are placed in the X direction and the Y direction, respectively. Correspondingly, two position sensors (not shown) are mounted on the reference plane 21a of the surface plate 21 via sensor support members (not shown). A first one of the position sensors emits laser light at the first reflective surface and receives laser light reflected from the first reflective surface to detect the position of the sample stage taken in the X direction. A second one of the position sensors emits laser light at the second reflective surface and receives light reflected from the second reflective surface to detect the position of the sample stage taken in the Y direction.

The operation of the two servo valves 126a and 126b equipped in the pneumatic stage 120 applied to the X stage 221 is controlled based on the result of the detection performed by the first position sensor which detects the position of the sample stage taken in the X direction. Similarly, the operation of the two servo valves equipped in the pneumatic stage applied to the Y stages 222 is controlled based on the result of the detection performed by the second position sensor which detects the position of the sample stage taken in the Y direction.

The Y stages 222 of one pair have the following common configurations. Each Y stage 222 has a guide shaft 222a arranged parallel to the Y direction and a drive member 222b moved along the guide shaft 222a. The guide shaft 222a has a rectangular cross section as viewed vertically in a direction perpendicular to the Y direction. The guide shaft 222a has four outer surfaces, i.e., a top surface, a bottom surface, and two side surfaces. These surfaces operate to guide movement of the drive member 222b. The drive member 222b is rectangular in cross section and shaped tubularly around the four outer surfaces of the guide shaft 222a. A hydrostatic air bearing (not shown) is incorporated in the drive member 222b. The drive member 222b has four inner surfaces corresponding to the four outer surfaces of the guide shaft 222a. In the hydrostatic air bearing, air films are formed between the four outer surfaces of the guide shaft 222a and the four inner surfaces of the drive member 222b which are close and opposite to the outer surfaces. Thus, the drive member 222b is floated relative to the guide shaft 222a. Consequently, the drive member 222a is supported by the hydrostatic air bearing so as to be movable in the Y direction that is the axial direction of the guide shaft 222a. The pneumatic stage using the hydrostatic air bearing is similar in fundamental configuration to the X stage 221 and so a description thereof is omitted.

The opposite ends of the guide shaft 222a are supported by leg portions 222c, respectively. Each leg portion 222c is shaped in the form of a rectangular cylinder. The leg portion 222c has an upper end portion bolted or otherwise secured to an end portion of the guide shaft 222a. The leg portion 222c has a lower end portion that is bolted or otherwise fixed to a seating 222d. The seating 222d is bolted or otherwise secured to the reference plane 21a of the surface plate 21. Because of this fastening structure, the guide shaft 222a is fixedly supported to the surface plate 21. The leg portions 222c are raised vertically relative to the reference plane 21a of the surface plate 21. The leg portions 222c and the seatings 222d for securing the guide shaft 222a on the surface plate 21 may be integral with each other.

The Y stages 222 of one pair are spaced a given distance from each other in the X direction. The drive members 222b of the Y stages 222 are coupled together by the guide shaft 221a of the X stage 221. As the two drive members 222b move in synchronism in the Y direction, the X stage 221 including the guide shaft 221a and the drive member 221b varies in position in the Y direction. Consequently, the sample stage mounted to the drive member 221b of the X stage 221 can be moved in the X and Y directions.

The structure of the positional deviation detection section is next described. In the present embodiment, the positional deviation detection section detects a relative positional deviation between the guide shaft 222a and the drive member 222b. The positional deviation detected by the positional deviation detection section affects the thickness dimensions of the air films formed by the hydrostatic air bearing in the gap portion between the guide shaft 222a and the drive member 222b. The positional deviation affecting the thickness dimensions of the air films means a relative positional deviation between the guide shaft 222a and the drive member 222b in a virtual plane orthogonal to the center axis of the guide shaft 222a. This positional deviation may be detected directly by the positional deviation detection section or detected indirectly. In the present embodiment, the relative positional deviation which occurs between the guide shaft 222a and the drive member 222b and which affects the thickness dimensions of the air films is detected indirectly as one example.

As shown in the above-referenced FIG. 2, the positional deviation detection section 30 is made up of two positional deviation detection sensors 30a and 30b. The sensor 30a is mounted to that of the four side surfaces of the leg portions 222c which faces in the X direction. The sensor 30b is mounted to that of the four side surfaces of the leg portions 222c which faces in the Y direction. That is, the two positional deviation detection sensors 30a and 30b are shifted angularly relative to each other by 90 degrees within a horizontal plane and mounted to the leg portions 222c. The two positional detection sensors 30a and 30b are disposed to face downward.

The positional deviation detection sensor 30a is disposed opposite to the reference plane 21a of the surface plate 21 in the Z direction. Also, the positional deviation detection sensor 30b is placed opposite to the reference plane 21a of the surface plate 21 in the Z direction. Each seating 222d has a top surface 222e disposed parallel to the reference plane 21a of the surface plate 21.

Each of the positional deviation detection sensors 30a and 30b is made of a displacement sensor, for example, which detects a variation in the distance from this sensor to a physical object as an amount of displacement of the object. In the present embodiment, the detection sensor 30a detects a distance L1 from the positional deviation detection sensor 30a to the reference plane 21a of the surface plate 21 while treating the reference plane 21a of the surface plate 21 as the object. The detection sensor 30b detects a distance L2 from the sensor 30b to the reference plane 21a of the surface plate 21 while treating the reference plane 21a of the surface plate 21 as the object.

Figure 4:
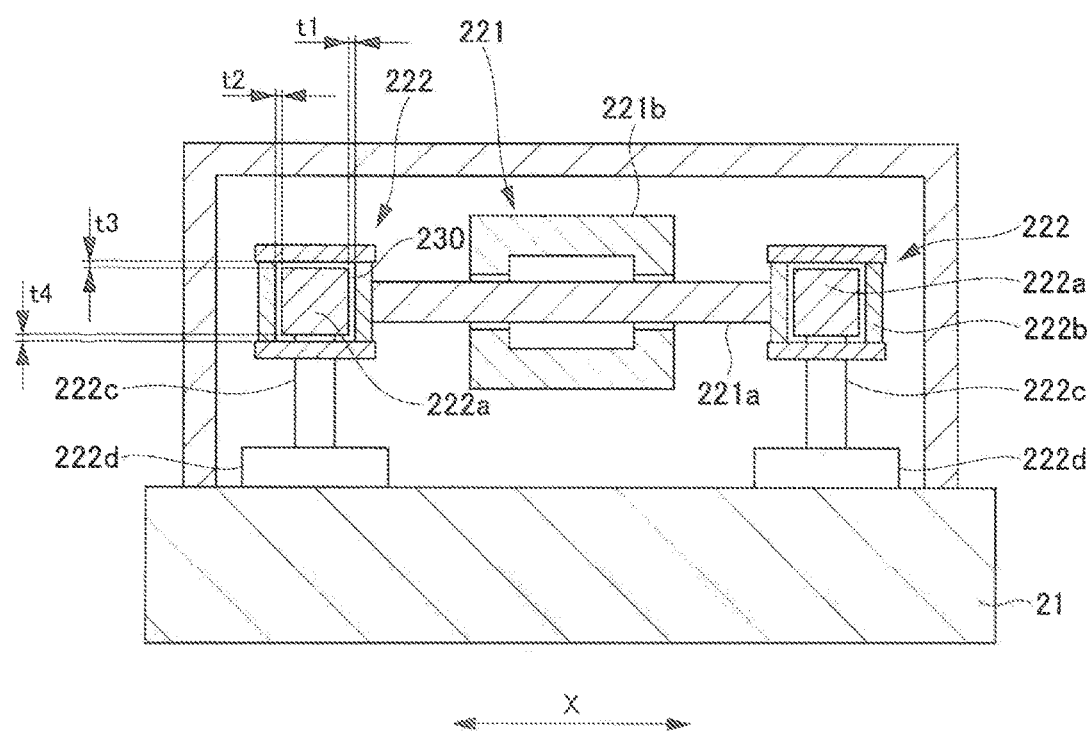
FIG. 4 is a view illustrating the manner in which air films formed in a gap portion created between a guide shaft and a drive member are uniform in thickness dimension.

The positional deviation detection sensors 30a and 30b are mounted to the leg portions 222c, for the following reason. When the relative positional deviation between the guide shaft 222a and the drive member 222b is zero, i.e., under ideal conditions, the thickness dimensions t1, t2, t3, and t4 of the air films 230 formed in the gap portion between the guide shaft 222a and the drive member 222b are uniform over the whole periphery of the guide shaft 222a including four surfaces as shown in FIG. 4. In the present specification, it is assumed that the dimensions t1, t2, t3, and t4 of the thicknesses of the air films 230 are stipulated by their minimum values. For example, where the thickness dimension t1 varies so as to gradually increase from the top surface of the guide shaft 222a toward the bottom surface, the thickness dimension t1 is stipulated by the minimum value of the dimension t1 of the thickness on the top surface side of the guide shaft 222a.

Figure 5:
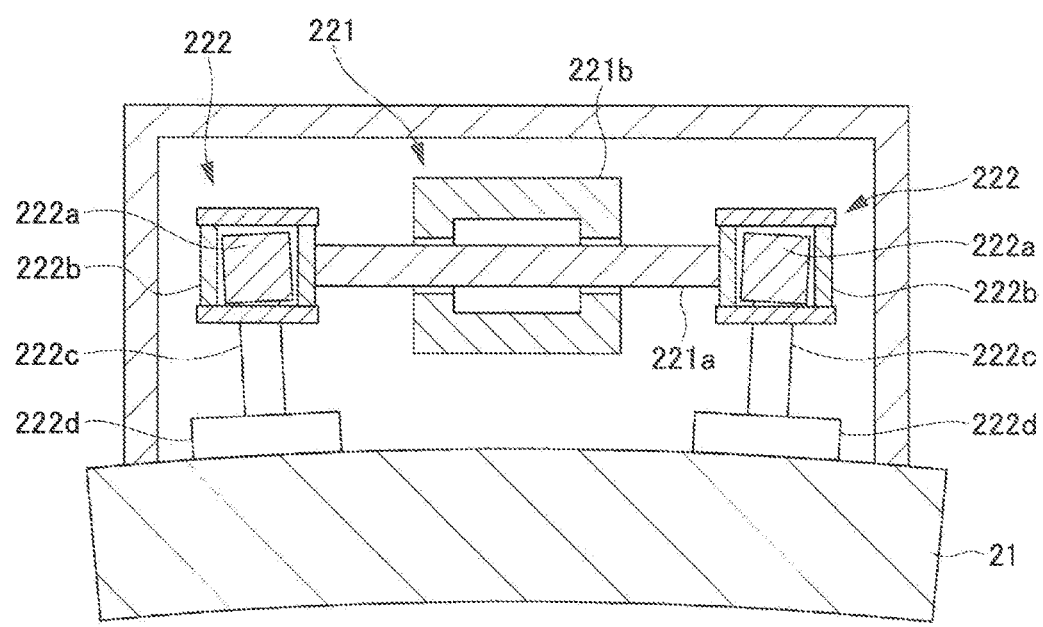
FIG. 5 is a view similar to FIG. 4, but in which the air films are not uniform in thickness dimension.

On the other hand, if the surface plate 21 is deformed or strained and the left and right leg portions 222c tilt in the X direction as shown in FIG. 5, a relative positional deviation occurs between the guide shaft 222a and the drive member 222b. This upsets the uniformity of the thickness dimensions t1, t2, t3, and t4 of the air films 230. Hence, the dimensions are out of balance, which means that, in the case of the thickness dimension t1, for example, the difference between maximum and minimum values of the dimension t1 is greater than that under the ideal conditions. If the amount of the positional deviation reaches a given amount, at least one of the thickness dimensions t1, t2, t3, and t4 becomes zero, i.e., contact occurs between the guide shaft 222a and the drive member 222b.

Figure 6:
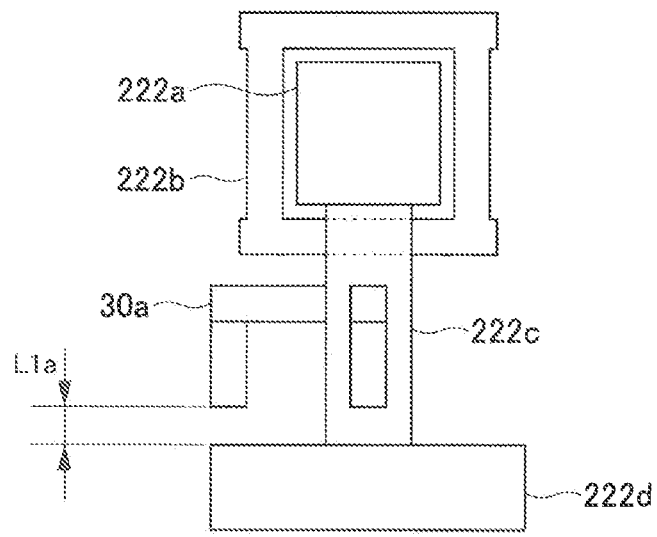
FIG. 6 is a view illustrating a distance detected by a positional deviation detection sensor under ideal conditions.
Figure 7:
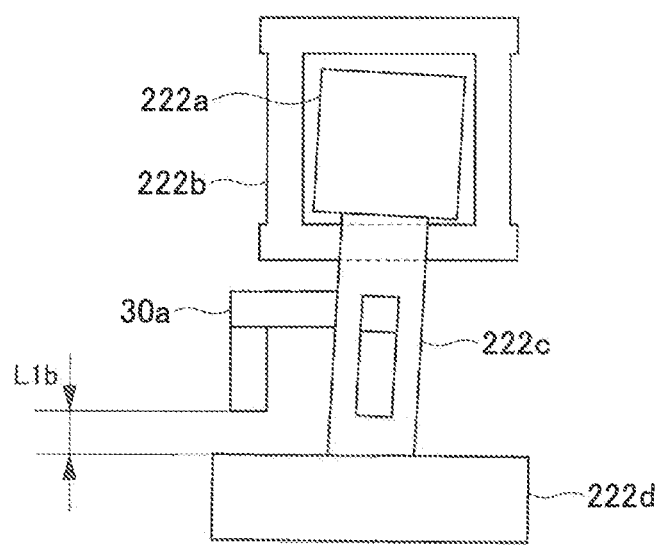
FIG. 7 is a view similar to FIG. 6, but in which a surface plate has deformed.

If the surface plate 21 deforms as described above, the position of the reference plane 21a varies according to the deformation of the surface plate 21, thus tilting the left and right leg portions 222c and the guide shaft 222a. On the other hand, the positions and postures of the left and right drive members 222b hardly vary because they are restricted by the guide shaft 221a of the X stage 221. Accordingly, assuming that the distance detected by the positional deviation detection sensor 30a under ideal conditions is L1a as shown in FIG. 6, if the surface plate 21 has deformed as described above, the distance detected by the detection sensor 30a is, as shown in FIG. 7, L1b that is different from the above-described L1a. The large-small relationship of the distances L1a and L1b is determined by how the surface plate 21 deforms. In particular, if the surface plate 21 deforms in such a way that the distance between the left and right seatings 222d decreases, the relationship, L1a<L1b, holds. Conversely, if the surface plate 21 deforms such that the distance between the left and right seatings 222d increases, the relationship, L1a>L1b, holds.

Where the left and right leg portions 222c are tilted in the X direction due to deformation of the surface plate 21, the thickness dimensions t1, t2, t3, and t4 of the air films 230 deviate by greater amounts from the thickness dimensions (see FIG. 4) achieved under the ideal conditions with increasing the tilt angle of the left and right leg portions 222c. The amount of the relative positional deviation between the guide shaft 222a and the drive member 222b increases according to the tilt angle of the left and right leg portions 222c. The tilt angle of the left and right leg portions 222c increases according to the amount of deformation of the surface plate 21. The distance L1 detected by the positional deviation detection sensor 30a deviates by a greater amount from the distance L1a achieved under the ideal conditions with increasing the tilt angle of the left and right leg portions 222c. Also, the distance L2 detected by the positional deviation detection sensor 30b varies according to tilt of the left and right leg portions 222c caused by deformation of the surface plate 21. Note that FIGS. 4-6 do not precisely reflect the shape and dimension of the stage apparatus and that they are shown exaggeratedly for assisting understanding of the present invention.

From the foregoing, it follows that the relative positional deviation between the guide shaft 222a and the drive member 222b is a parameter affecting the thickness dimensions t1, t2, t3, and t4 of the air films 230 and that variations in the distances L1 and L2 detected by the positional deviation detection sensors 30a and 30b are indexes indicative of the relative positional deviation between the guide shaft 222a and the drive member 222b. Therefore, the relative positional deviation which occurs between the guide shaft 222a and the drive member 222b and which affects the thickness dimensions t1, t2, t3, and t4 of the air films 230 by mounting the positional deviation detection sensors 30a and 30b to the leg portions 222c can be indirectly detected. Consequently, the condition of the stage apparatus 12 can be judged based on the distances L1 and L2 detected by the detection sensors 30a and 30b. The processing functions of the stage apparatus 12 including individual decision steps are described below.

Figure 8:
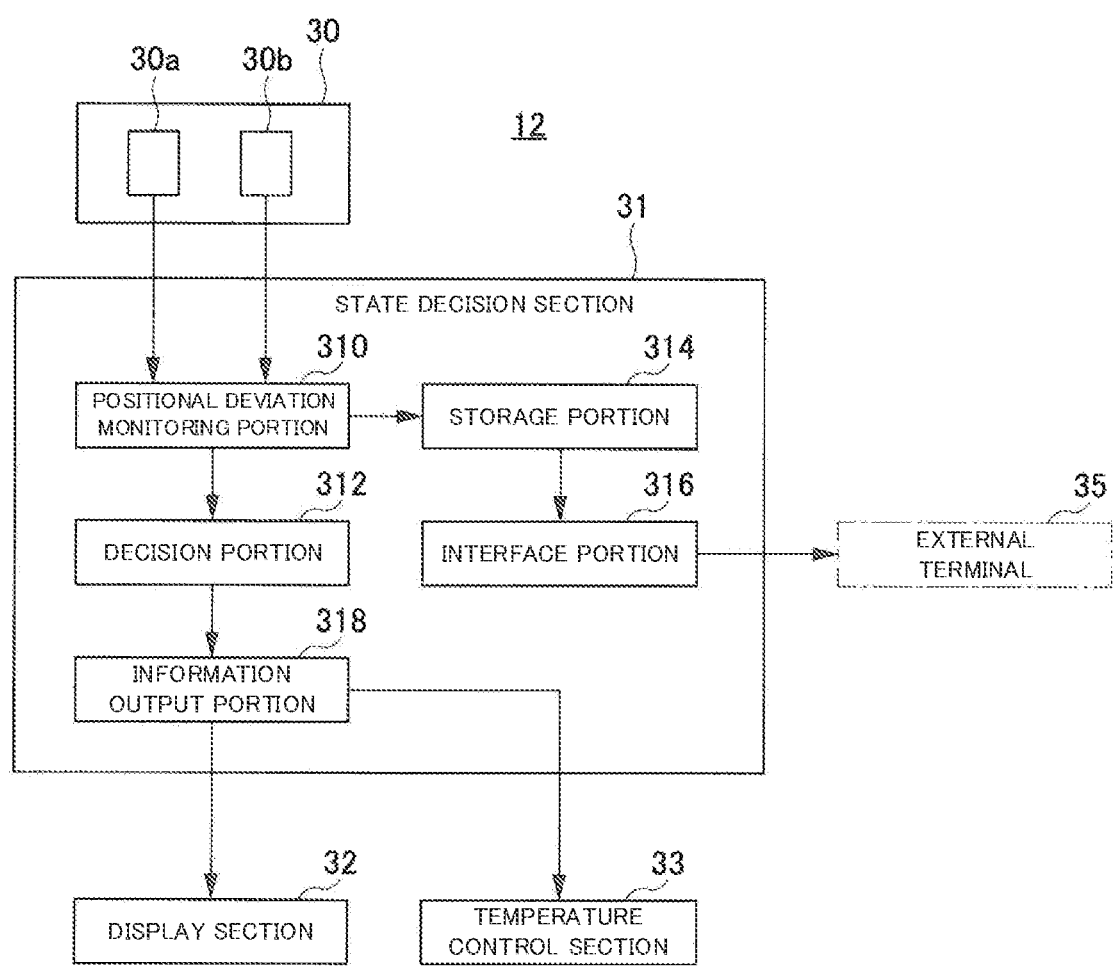
FIG. 8 is a block diagram illustrating processing functions of the stage apparatus shown in FIGS. 1 and 2.

FIG. 8 is a block diagram illustrating processing functions of the stage apparatus associated with one embodiment of the present invention. As shown, the stage apparatus 12 has a state decision section 31 for making a decision on the condition of the apparatus 12 itself, a display section 32 for displaying various kinds of information, and a temperature control section 33 for controlling the temperature of the surface plate 21. The display section 32 is made of a liquid crystal display or an organic EL display, for example. The display section 32 may be stationary or mobile.

Figure 9:
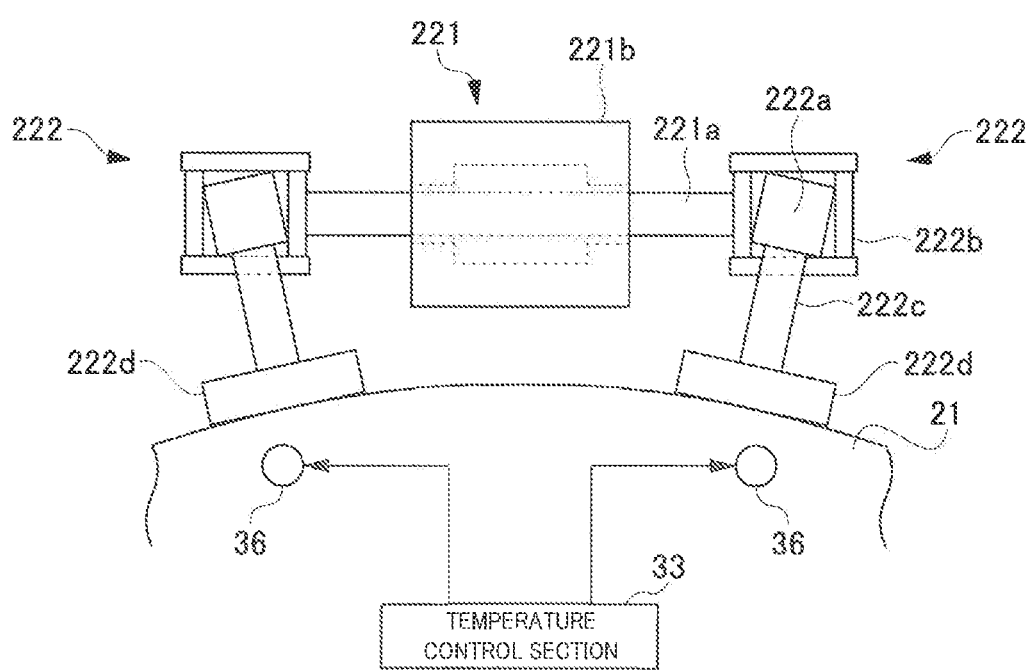
FIG. 9 is a schematic view showing an example of configuration for controlling the temperature of the surface plate.

The temperature control section 33 controls the temperature of the surface plate 21 to a reference temperature. As shown in FIG. 9, the surface plate 21 is formed with liquid passages 36 which pass near the positions at which the seatings 222d are mounted. The liquid passages 36 are connected to the temperature control section 33, which in turn has a liquid thermometer for measuring the temperature of a liquid (such as water) flowing through the liquid passages 36, as well as a temperature control section for adjusting the temperature of the liquid in a manner not illustrated. The temperature of the liquid flowing through the liquid passages 36 depends on the temperature of the surface plate 21. That is, the temperature of the surface plate 21 can be detected as the temperature of the liquid. Accordingly, the temperature control section 33 adjusts the temperature of the liquid such that the temperature of the liquid measured by the liquid thermometer, i.e., the temperature of the surface plate 21, equals the reference temperature.

Information about the distance L1 detected by the positional deviation detection sensor 30a and information about the distance L2 detected by the positional deviation detection sensor 30b are accepted into the state decision section 31 in response to the result of the detection of the positional deviation performed by the positional deviation detection section 30. The state decision section 31 makes a decision on the condition of the stage apparatus 12 based on the information about the distances L1 and L2 accepted from the positional deviation detection sensors 30a and 30b and outputs information responsive to the decision. Furthermore, the state decision section 31 outputs information which is responsive to the decision and which is at least one of information regarding maintenance of the stage apparatus 12 and information for correction of the positional deviation.

In the present embodiment, it is assumed, as one example, that the state decision section 31 outputs two sets of information responsive to the decision. One set of information is regarding maintenance of the stage apparatus 12, while the other set of information is used for correction of the positional deviation. It is also assumed that the state decision section 31 outputs information concerning maintenance of the stage apparatus 12 to the display section 32 and outputs information for correction of the positional deviation to the temperature control section 33.

The state decision section 31 has a positional deviation monitoring portion 310 for monitoring the amount of deviation between positional deviations respectively detected by the positional deviation detection sensors 30a and 30b, a decision portion 312 for judging the condition of the apparatus itself by comparing the amount of deviation monitored by the positional deviation monitoring portion 310 against a preset threshold value, a storage portion 314 for storing history information indicating chronological changes of the amount of deviation between the positional deviations respectively detected by the positional deviation detection sensors 30a and 30b, an interface portion 316 for reading out the history information stored in the storage portion 314, and an information output portion 318 for outputting information responsive to the results of the decision done by the decision portion 312. The functions of the various portions are described in detail below.

The positional deviation monitoring portion 310 accepts information about the distance L1 detected by the positional deviation detection sensor 30a and information about the distance L2 detected by the positional deviation detection sensor 30b. As described previously, a variation in the distance L1 gives an index indicative of the relative positional deviation between the guide shaft 222a and the drive member 222b. Similarly, a variation in the distance L2 gives an index indicative of the relative positional deviation between the guide shaft 222a and the drive member 222b. Accordingly, the positional deviation monitoring portion 310 monitors the variation in the distance L1 detected by the positional deviation detection sensor 30a and the variation in the distance L2 detected by the positional deviation detection sensor 30b and treats the monitored variations as the relative positional deviation between the guide shaft and the drive member 222b. In this case, the amount of the relative positional deviation between the guide shaft 222a and the drive member 222b is represented by the amount of variation of the distance L1 detected by the positional deviation detection sensor 30a and the amount of variation of the distance L2 detected by the positional deviation detection sensor 30b. The amount of variation of the distance L1 is also represented by the difference between the distance L1 actually detected by the positional deviation detection sensor 30a and the distance L1a obtained under the above-described ideal conditions. This theory also applies to the amount of variation of the distance L2.

Figure 10:
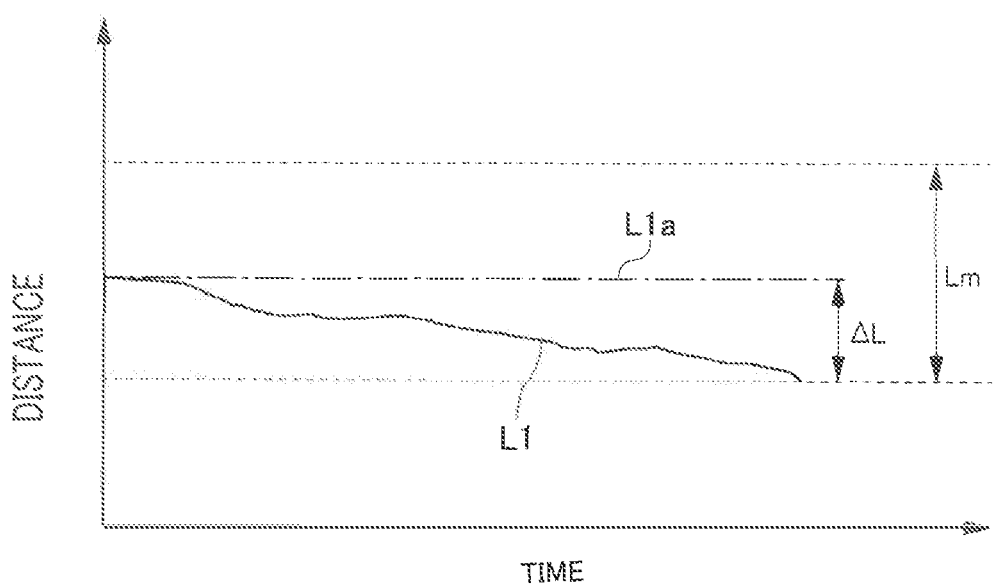
FIG. 10 illustrates operational history information stored in a storage section.

The positional deviation monitoring portion 310 writes information about the distances L1 and L2 accepted from the positional deviation detection sensors 30a and 30b into the storage portion 314. As a result, history information indicative of chronological variation (as shown in FIG. 10) of the distance L1 detected by the positional deviation detection sensor 30a is stored in the storage portion 314. Similarly, history information (not illustrated) indicative of chronological variation of the distance L2 detected by the positional deviation detection sensor 30b is stored in the storage portion 314. The chronological variations of the distances L1 and L2 are equivalent to chronological variations of the amounts of the positional deviations respectively detected by the positional deviation detection sensors 30a and 30b. In FIG. 10, the vertical axis indicates the distance L1 detected by the positional deviation detection sensor 30a, while the horizontal axis indicates time. The amount of variation $\Delta L$ of the distance L1 is given by the difference between the distances L1a and L1 as described previously. If the amount of variation $\Delta L$ exceeds a tolerable range Lm, for example, maintenance of the present apparatus is needed. The same principle also applies to the amount of variation of the distance L2.

The decision portion 312 compares the amount of deviation monitored by the positional deviation monitoring portion 310 against the preset threshold value in order to judge the conditions of the stage apparatus 12 itself. The judged conditions include conditions regarding maintenance of the apparatus itself and conditions regarding temperature control of the surface plate 21. The conditions regarding maintenance of the present apparatus include a stable operative condition needing no maintenance of the apparatus itself, a maintenance alert condition in which maintenance of the present apparatus will be required until a given time, and an immediate maintenance needed condition in which immediate maintenance of the present apparatus is required. Conditions regarding temperature control of the surface plate 21 include a condition in which the temperature of the surface plate 21 is coincident with a reference temperature, a condition in which the temperature of the surface plate 21 deviates from the reference temperature but it is not necessary to modify the reference temperature, and a condition in which the temperature of the surface plate 21 deviates from the reference temperature and the reference temperature needs to be modified.

The decision portion 312 uses the following two kinds of threshold values for comparison with the amount of deviation monitored by the positional deviation monitoring portion 310. One kind is a threshold value for maintenance. The other is a threshold value for temperature control of the surface plate. Each kind of threshold value is at least one threshold value and two or more threshold values are used as needed. The threshold value for maintenance is a preset threshold value for making a decision on maintenance of the stage apparatus 12 itself. The threshold value for temperature control of the surface plate is a preset threshold value for making a decision on the condition regarding temperature control of the surface plate 21.

The interface portion 316 is used for connection of an external terminal 35. When the external terminal 35 is connected with the interface portion 316, the history information stored in the storage portion 314 can be read out to the external terminal 35 via the interface portion 316.

The information output portion 318 outputs sets of information responsive to the result of the decision made by the decision portion 312. One set is information regarding maintenance of the present apparatus. Another set is information for correction of the relative positional deviation between the guide shaft 222a and the drive member 222b. In the present embodiment, one example of the information that is output for correction of the positional deviation is regarding temperature control of the surface plate 21. The temperature of the surface plate 21 is affected by the temperature of an environment where the stage apparatus 12 is mounted. If the temperature of the surface plate 21 varies, the surface plate 21 itself slightly deforms. This may bring about a relative positional deviation between the guide shaft 222a and the drive member 222b. Therefore, the positional deviation can be corrected by controlling the temperature of the surface plate 21.

If the decision portion 312 determines that the amount of deviation monitored by the positional deviation monitoring portion 310 has reached a given threshold value for maintenance, the information output portion 318 outputs such information to the display section 32 that is regarding maintenance of the present apparatus and that permits identification of maintenance times. In response, the display section 32 provides a display of the information permitting identification of maintenance times. The given threshold value for maintenance is one of at least one or more threshold values for maintenance and has been previously set for determination of a timing at which the information permitting identification of maintenance times is output. If the decision portion 312 determines that the amount of deviation monitored by the positional deviation monitoring portion 310 has reached the given threshold value for temperature control of the surface plate, the information output portion 318 outputs such information for giving an instruction to modify the reference temperature to the temperature control section 33 that is regarding temperature control of the surface plate 21. Consequently, the temperature control section 33 modifies the reference temperature according to the instruction and controls the temperature of the surface plate 21 to the modified reference temperature. In this case, the given threshold value for temperature control of the surface plate is one of at least one threshold value for temperature control of the surface plate and has been preset for determining a timing at which the information for giving an instruction to modify the reference temperature is output.

Figure 11:
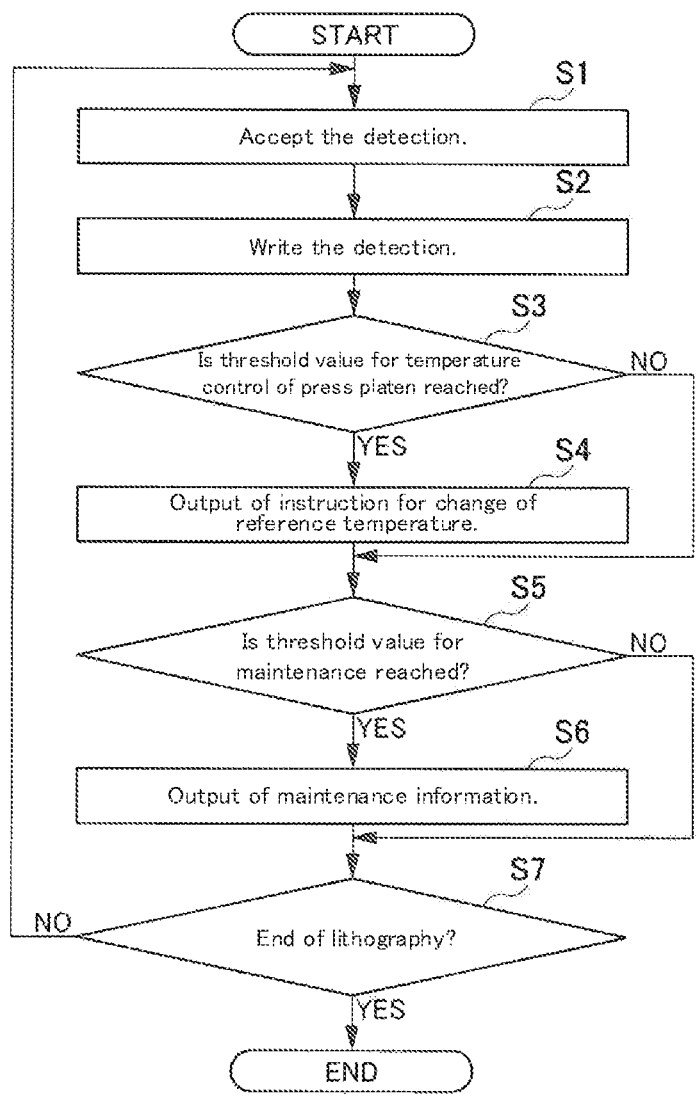
FIG. 11 is a flowchart illustrating a procedure of processing performed within the stage apparatus during operation of the electron beam lithography system.

FIG. 11 is a flowchart illustrating a procedure of processing performed in the stage apparatus 12 during operation of the electron beam lithography system 10. First, the positional deviation monitoring portion 310 accepts the result of the detection of the positional deviation performed by the positional deviation detection section 30 (step S1). At this time, the positional deviation monitoring portion 310 accepts information about the distance L1 detected by the positional deviation detection sensor 30a and information about the distance L2 detected by the positional deviation detection sensor 30b. Also, the positional deviation monitoring portion 310 gives the detected positional deviation from the positional deviation detection section 30 to the decision portion 312.

Then, the positional deviation monitoring portion 310 writes the detected positional deviation accepted at step S1 into the storage portion 314 (step S2). The decision portion 312 then makes a decision as to whether the amount of the positional deviation has reached the given threshold value for temperature control of the surface plate based on the detected positional deviation from the positional deviation monitoring portion 310 (step S3). If it is determined that the amount of the positional deviation has reached the given threshold value for temperature control of the surface plate, the decision portion 312 notifies the information output portion 318 of the decision result. In response to the notification, the information output portion 318 outputs information for giving an instruction to modify the reference temperature to the temperature control section 33 (step S4). If it is determined that the amount of the positional deviation has not reached the given threshold value for temperature control of the surface plate, the decision portion 312 skips step S4.

Then, the decision portion 312 makes a decision as to whether the amount of the positional deviation has reached the given threshold value for maintenance based on the detected positional deviation given from the positional deviation monitoring portion 310 (step S5). If it is determined that the amount of the positional deviation has reached the given threshold value for maintenance, the decision portion 312 notifies the information output portion 318 of the decision result. In response, the information output portion 318 outputs information regarding maintenance of the present stage apparatus 12 to the display section 32 (step S6). At this time, the information output portion 318 outputs information permitting identification of the maintenance times as the information regarding maintenance of the present apparatus. Consequently, the information permitting identification of the maintenance times is displayed on the display section 32. One conceivable example of the information permitting identification of the maintenance times is the message "Please execute maintenance until xxx." Another example is the message "There are XX days left until the maintenance time." If it is determined that the amount of the positional deviation has not reached the given threshold value for maintenance, the decision portion 312 skips step S6.

Then, the state decision section 31 makes a decision as to whether the electron beam lithography using the beam source 14 has ended (step S7). If the lithography has not ended, the state decision section 31 returns to step S1 and performs processing similar to the foregoing. If the electron beam lithography has ended, the processing sequence is ended.

In the above-described procedure of processing, if the decision portion 312 determines that the amount of positional deviation has reached the given threshold value for maintenance at step S5, the information output portion 318 outputs information permitting identification of maintenance times at step S6 as information regarding maintenance of the present stage apparatus 12. The present invention is not restricted to this example. For example, the information regarding maintenance of the present apparatus which is output at step S6 by the information output portion 318 may also be information indicating conditions regarding maintenance of the present apparatus. In particular, the information regarding maintenance of the present apparatus may be information indicating which one of a stable condition, a maintenance alert condition, and a maintenance warning condition. Furthermore, the information indicating the condition regarding maintenance of the present apparatus may be always output from the state decision section 31 to the display section 32 according to the result of a comparison of the amount of the positional deviation with one or more preset threshold values for maintenance. Consequently, the user of the electron beam lithography system 10 who performs maintenance and inspection can judge the condition of the stage apparatus 12, i.e., in which one of the stable condition, the maintenance alert condition, and the maintenance warning condition is the apparatus 12, by visually checking the information displayed on the display section 32.

As described thus far, in the electron beam lithography system 10 associated with one embodiment of the present invention, a relative positional deviation which occurs between the guide shaft 222a and the drive member 222b and which affects the thickness dimensions of the air films 230 is detected by the positional deviation detection section 30. The state decision section 31 judges the condition of the stage apparatus 12 based on the detection and outputs information responsive to the detection. Consequently, the user, for example, of the electron beam lithography system 10 can grasp the condition of the stage apparatus 12 based on the information output by the state decision section 31. This permits the user to perform maintenance of the stage apparatus 12 in advance to prevent contact of the guide shaft 222a with the drive member 222b. Therefore, contact of the guide shaft 222a with the drive member 222b can be effectively suppressed without the need of increasing the thickness dimensions of the air films 230 formed by the hydrostatic air bearing 128.

Also, in the present embodiment, the state decision section 31 outputs information regarding maintenance of the stage apparatus 12 as information responsive to the decision. Thus, maintenance of the stage apparatus 12 can be carried out at appropriate times. As a result, it is anticipated that the following effects will accrue.

Maintenance of the stage apparatus 12 is performed, for example, in accordance with the following procedure. Stress is accumulated in the leg portions 222c and other portions by deformation of the surface plate 21. To relieve the stress, the bolts which fasten the seatings 222d to the surface plate 21 are loosened. Then, the leg portions 222c and the seatings 222d supporting the guide shaft 222a are fine adjusted in position. Thereafter, the bolts are tightened to secure the seatings 222d onto the surface plate 21. Such a maintenance work presents almost no problem as long as it is carried out at preset regular maintenance times according to a yearly schedule, for example, based on a schedule of operation of the electron beam lithography system 10. However, if the above-described maintenance work is done due to abnormal motion of the drive member 222b during operation of the electron beam lithography system 10, it is necessary to interrupt the operation of the lithography system 10 for a long time. This greatly reduces the operation rate of the lithography system 10. If maintenance work is done frequently in order to prevent the drive member 222b from making abnormal motion during operation of the lithography system 10, maintenance work will be carried out frequently at improper timings, thus resulting in wasteful maintenance works.

According to the present embodiment, maintenance work can be carried out at appropriate timings before the drive member 222b produces abnormal motion. Consequently, the operation rate of the electron beam lithography system 10 can be prevented from decreasing while omitting wasteful maintenance works.

Furthermore, in the present embodiment, the state decision section 31 outputs information which is responsive to the decision and which is used for correction of the relative positional deviation between each guide shaft 222a and its respective drive member 222b. Consequently, the positional deviation can be suppressed to low levels for a long time.

In addition, in the present embodiment, if the decision portion 312 determines that the amount of the positional deviation has reached the given threshold value for maintenance, the information output portion 318 outputs information which permits identification of maintenance times of the stage apparatus 12 and which can be regarded as information concerning maintenance of the stage apparatus 12. This permits the user to recognize the time of next maintenance of the stage apparatus 12. As a consequence, the maintenance time of the stage apparatus 12 can be determined while taking account of the operational state of the electron beam lithography system 10.

Further, in the present embodiment, if the decision portion 312 determines that the amount of the positional deviation has reached the given threshold value for temperature control of the surface plate, the information output portion 318 outputs information which gives an instruction to change the reference temperature to the temperature control section 33 and which is regarded as information for correcting the positional deviation. Consequently, any positional deviation caused by temperature variations of the surface plate 21 can be suppressed.

Also, in the present embodiment, the state decision section 31 has the storage portion 314 for storing history information indicating chronological variations of the amount of the positional deviation detected by the positional deviation detection section 30 and the interface portion 316 for reading out the history information stored in the storage portion 314. Consequently, the history information stored in the storage portion 314 can be read out to the external terminal 35 via the interface portion 316. As a result, the operator of the external terminal 35 can examine the correlation between the amount of the positional deviation and temperature variations of the surface plate 21. In addition, the operator of the external terminal 35 can forecast maintenance times for the stage apparatus 12 with greater accuracy by the use of the history information read from the storage portion 314.

<Modifications and Others>

It is to be understood that the technical scope of the present invention is not restricted to the foregoing embodiments but rather includes various modifications and improvements as long as certain effects produced by constituent components of the present invention and combinations thereof can be derived.

For example, in the above embodiments, a displacement sensor is used as one example of the positional deviation detection sensor. Any other type of sensor may be used if it can detect the relative positional deviation between each guide shaft 222a and its respective drive member 222b.

Furthermore, in the above embodiments, the positional deviation detection section 30 is configured to detect the distances from the positional deviation detection sensors 30a, 30b to the reference plane 21a of the surface plate 21 in order to indirectly detect the relative positional deviation between each guide shaft 222a and its respective drive member 222b. The present invention is not restricted to this example. The detection section 30 may also be configured to detect the distances from the positional deviation detection sensors 30a and 30b to the top surfaces 222e of the seatings 222d.

In addition, in the above embodiments, the positional deviation detection section 30 is configured to indirectly detect the relative positional deviation between each guide shaft 222a and its respective drive member 222b. The present invention is not restricted to this example. The relative positional deviation between each guide shaft 222a and its respective drive member 222b may be directly detected. In particular, each one displacement sensor acting as a positional deviation detection sensor may be mounted to a respective one of the four main surfaces (top, bottom, and two side surfaces) of each drive member 222b, and the distances from the displacement sensors to the four main surfaces (top, bottom, and two side surfaces) of the guide shaft 222a may be detected.

Further, in the above embodiments, a stone-built surface plate is adopted as a preferred example of the surface plate 21. The present invention is not restricted to this example. A metallic surface plate may also be used as the surface plate 21.

In addition, in the above embodiments, the hydrostatic air bearing 128 that is one type of hydrostatic gas bearing is taken as one example of hydrostatic fluid bearing. The present invention is not restricted to this example. A hydrostatic liquid bearing using water or oil as a lubricating fluid may also be used. Where the stage mechanism 22 is disposed in a vacuum, it is needed to use a hydrostatic gas bearing as a hydrostatic fluid bearing.

Further, in the above embodiments, the two-axis stage mechanism 22 having the X stage 221 and the Y stages 222 is taken as an example. The present invention is not restricted to this example. The invention may also be applied to a one-axis stage mechanism. Where the present invention is applied to the two-axis stage mechanism 22, deformation of the surface plate 21 produces greater effects than where applied to a one-axis stage mechanism and so greater advantageous effects accrue.

Further, in the description of the above embodiments, the electron beam lithography system 10 equipped with the stage apparatus 12 is taken as an example. The present invention can be applied to a wide range of processors in which the sample 11 movably supported by the stage apparatus 12 is processed in a given manner, including the electron beam lithography system 10. One example of such processors is an electron beam inspection system for inspecting samples for appearance or defects using an electron beam. Another example is semiconductor fabrication equipment using an electron beam. A further example is a semiconductor inspection system. A still other example is a metrology instrument for measuring samples using an electron beam. A yet other example is an apparatus or machine for processing samples using an electron beam.

The invention claimed is:

1. A stage apparatus comprising:
a surface plate;
a guide shaft fixedly supported to the surface plate;
a drive member that moves along the guide shaft such that a gap portion is left between the guide shaft and the drive member;
a hydrostatic fluid bearing that forms fluid films in the gap portion, the fluid films having thickness dimensions;
a positional deviation detection section for detecting a relative positional deviation which occurs between the guide shaft and the drive member and which affects the thickness dimensions of the fluid films;
a state decision section for making a decision on a condition of the stage apparatus itself based on the positional deviation detected by the positional deviation detection section by comparing an amount of the positional deviation monitored by the positional deviation monitoring portion with at least one preset threshold value and outputting information responsive to the decision; and
an information output portion,
wherein the decision is at least one of a decision as to whether said amount of said positional deviation has reached a given threshold value for maintenance or a decision as to whether said amount of said positional deviation has reached a given threshold value for temperature control of the surface plate, and
wherein the information output portion outputs information permitting identification of maintenance times as information regarding maintenance of the stage apparatus itself if the decision portion has determined that the amount of positional deviation has reached the threshold value for maintenance and the information output portion outputs information for giving an instruction to change the reference temperature as information for correction of the positional deviations if the decision portion has determined that the amount of positional deviation has reached the threshold value for temperature control of the surface plate.

2. The stage apparatus as set forth in claim 1, wherein said state decision section comprises:
a positional deviation monitoring portion for monitoring an amount of said positional deviation detected by said positional deviation detection section; and
a decision portion for making the decision on the condition of the stage apparatus itself,
wherein the information output portion outputs information responsive to a result of the decision made by the decision portion.

3. The stage apparatus as set forth in claim 1, further comprising a display section for displaying the information regarding maintenance of the stage apparatus itself.

4. The stage apparatus as set forth in claim 2, further comprising: a temperature control section for controlling a temperature of said surface plate to a reference temperature.

5. The stage apparatus as set forth in claim 1, wherein said state decision section comprises: a storage portion for storing history information indicative of chronological variations of an amount of said positional deviation detected by said positional deviation detection portion; and an interface portion for reading out the history information stored in the storage portion.

6. An electron beam lithography system comprising a stage apparatus as set forth in claim 1,
wherein a pattern is delineated by use of an electron beam on a sample movably supported by the stage apparatus.

* * * * *